United States Patent
Popescu

(10) Patent No.: US 10,746,828 B2
(45) Date of Patent: Aug. 18, 2020

(54) METHOD AND APPARATUS IMAGE DATA GENERATION IN AN EXAMINATION CHAMBER OF A MAGNETIC RESONANCE APPARATUS

(71) Applicant: Siemens Healthcare GmbH, Erlangen (DE)

(72) Inventor: Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 127 days.

(21) Appl. No.: 16/100,486

(22) Filed: Aug. 10, 2018

(65) Prior Publication Data
US 2019/0049537 A1    Feb. 14, 2019

(30) Foreign Application Priority Data
Aug. 11, 2017    (DE) .......................... 10 2017 214 088

(51) Int. Cl.
| | |
|---|---|
| *G01R 33/422* | (2006.01) |
| *H04N 5/225* | (2006.01) |
| *H04N 9/31* | (2006.01) |
| *G01R 33/34* | (2006.01) |
| *G01R 33/28* | (2006.01) |
| *G06T 7/521* | (2017.01) |

(52) U.S. Cl.
CPC ..... *G01R 33/422* (2013.01); *G01R 33/34007* (2013.01); *H04N 5/2251* (2013.01); *H04N 9/3141* (2013.01); *G01R 33/283* (2013.01); *G06T 7/521* (2017.01); *G06T 2207/10028* (2013.01); *G06T 2207/10048* (2013.01); *H04N 5/2257* (2013.01)

(58) Field of Classification Search
CPC ............ G01R 33/422; G01R 33/34007; H04N 5/2251; H04N 5/3141
USPC ........................................................ 324/307
See application file for complete search history.

(56) References Cited

U.S. PATENT DOCUMENTS

| | | | |
|---|---|---|---|
| 9,235,973 B2 | 1/2016 | Popescu | |
| 2005/0283068 A1* | 12/2005 | Zuccolotto | ........... A61B 5/0555 600/410 |
| 2009/0209846 A1* | 8/2009 | Bammer | ................ A61B 5/055 600/421 |

(Continued)

FOREIGN PATENT DOCUMENTS

| | | |
|---|---|---|
| DE | 4442656 A1 | 6/1995 |
| WO | WO-2016/172838 A1 | 11/2016 |

OTHER PUBLICATIONS

Anonymous authors, "RF Shielded LCD Image Beamer for MRI Examination Room," Ip.com (2003).

*Primary Examiner* — Patrick Assouad
*Assistant Examiner* — Demetrius R Pretlow
(74) *Attorney, Agent, or Firm* — Schiff Hardin LLP

(57) ABSTRACT

In a method and apparatus for generating image data (other than magnetic resonance (MR) data) in an examination chamber of an MR scanner, an image generating unit generates the image data, a first RF-shielding portion completely encloses the image generating unit except for at least one opening for exchanging image data with the surrounding environment, and a horn-shaped second RF shielding portion is arranged around the at least one opening and is electrically connected with the first RF shielding portion such that the at least one opening opens into the horn-shaped second RF shielding portion.

12 Claims, 4 Drawing Sheets

(56) References Cited

U.S. PATENT DOCUMENTS

| | | | |
|---|---|---|---|
| 2010/0059679 A1* | 3/2010 | Albrecht | A61B 5/0555 |
| | | | 250/338.1 |
| 2010/0245543 A1* | 9/2010 | Greer | G01R 33/283 |
| | | | 348/46 |
| 2013/0137964 A1* | 5/2013 | Schellenberg | A61B 5/0555 |
| | | | 600/411 |
| 2013/0274590 A1* | 10/2013 | Auboiroux | A61N 7/02 |
| | | | 600/411 |
| 2014/0253122 A1* | 9/2014 | Leussler | G01R 33/4215 |
| | | | 324/309 |
| 2014/0354282 A1* | 12/2014 | Kusik | G01R 33/283 |
| | | | 324/322 |
| 2016/0113592 A1* | 4/2016 | Murugappan | A61B 5/7285 |
| | | | 600/413 |
| 2016/0154075 A1 | 6/2016 | Song et al. | |
| 2016/0203265 A1 | 7/2016 | Hardie et al. | |
| 2016/0367169 A1 | 12/2016 | Hardie et al. | |
| 2016/0370870 A1 | 12/2016 | Hengerer et al. | |
| 2017/0082703 A1* | 3/2017 | Rapoport | G01R 33/28 |
| 2017/0146619 A1* | 5/2017 | Strauss | G01R 33/283 |
| 2017/0212191 A1* | 7/2017 | Biber | G01R 33/283 |
| 2018/0271396 A1* | 9/2018 | Watts | A61B 5/0064 |
| 2020/0025847 A1* | 1/2020 | Verghese | G01R 33/34007 |

* cited by examiner

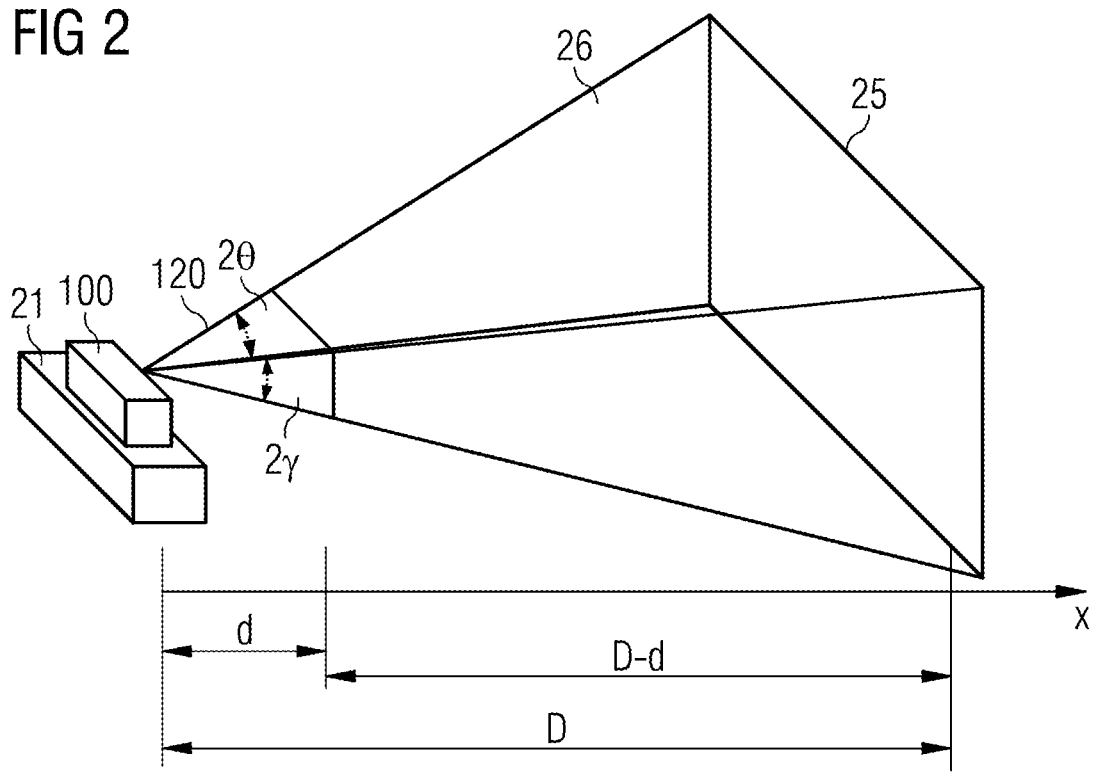
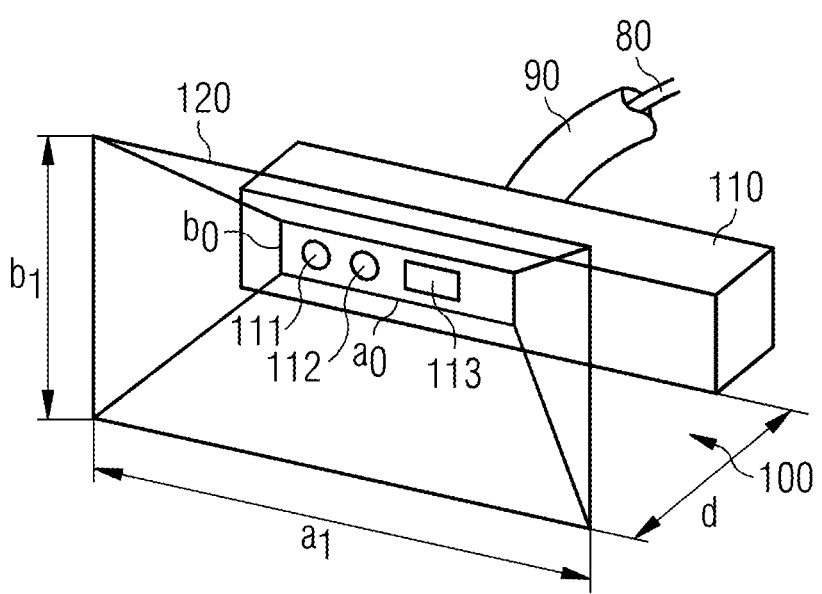

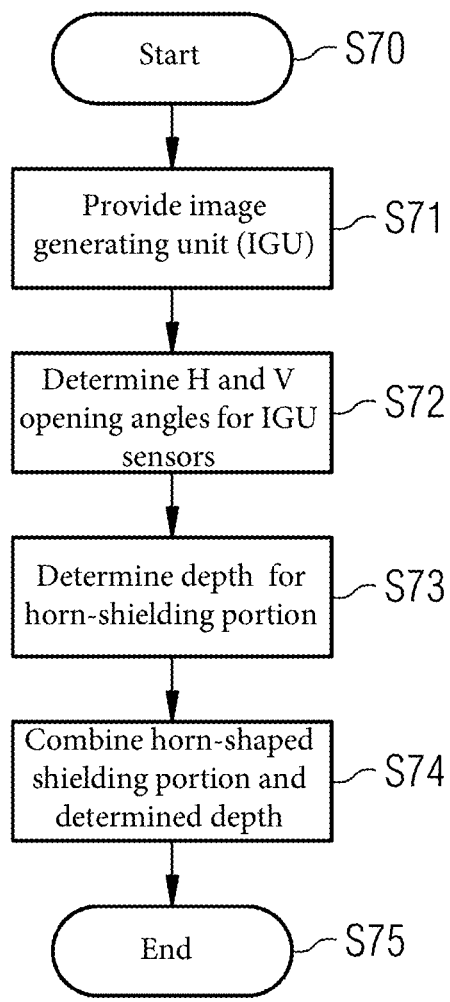

METHOD AND APPARATUS IMAGE DATA GENERATION IN AN EXAMINATION CHAMBER OF A MAGNETIC RESONANCE APPARATUS

BACKGROUND OF THE INVENTION

Field of the Invention

The present invention concerns an image generating unit that is suitable for use in an examination chamber of a magnetic resonance (MR) apparatus, the image generating unit producing image information other than the image data acquired by the MR apparatus.

Description of the Prior Art

In an examination chamber of an MR scanner, additional video devices such as a video camera are often needed to produce non-diagnostic image data relating to the person under examination, or to project image data through a projector into the MR system for functional imaging, in which changes in brain activity when observing various images are measured. DE 10 2015 211 331 A1, DE 10 2015 211 148 A1 and DE 10 2015 200 477 A1 each disclose a camera arranged inside an examination chamber in which a medical imaging apparatus is located.

In addition, the image data generated may be used to entertain the person under examination or to decorate the examination chamber. These electronic devices in the examination chamber of the MR scanner may generate electromagnetic radiation, and thus electromagnetic interference, or EMI, which may interfere significantly with the sensitive receiving system of the MR scanner for receiving the MR signals.

It is therefore necessary to provide the devices or systems for image generation with RF shielding. It is known, for example, to position RF shielding around an LCD projector in the examination chamber. The optical light beam is transferred through a shielded circular waveguide within the projector. However, the light beam of a projector widens greatly from the projector, thus making the length of the effective waveguide very large (see IP.com of Jun. 24, 2003, publication number IPCOM000016474D). In the embodiment selected therein, the waveguide contains lenses and prisms for controlling the diameter of the projection beam. This use of lenses and prisms complicates the overall structure, however, and thus makes production of such a device more expensive.

Other shielding methods enclose a video camera or a video projector completely in closed shielding, and an optically transparent window is provided that has an electrically conductive film, thereby permitting an outward view through the window for the video camera while at the same time preventing RF fields from being emitted through the window.

In more complex video systems for generating image data, such as a video camera with an infrared sensor or a so-called Time-of-Flight depth sensor and microphones, it is difficult to achieve this shielding of the system for generating the image data. The optically transparent window will, for example, reflect part of the infrared radiation that is emitted by the depth sensor. When using a shielded waveguide, which operates below its cut-off wavelength, additional lenses are necessary to propagate the various emitted signals through the small-diameter waveguide. Furthermore, this may lead to distortion in the captured image data or in the projected image data. Furthermore, costs are also increased.

SUMMARY OF THE INVENTION

An object of the present invention is to provide a simply configured system for image generation in an examination chamber of an MR scanner, which has a simple structure but nonetheless enables satisfactory shielding with regard to the MR system.

According to a first aspect of the invention, an apparatus for generating image data in an examination chamber of an MR scanner that acquires raw data from which diagnostic image data are reconstructed, and an image generating unit that generates image data that are different from the raw data and the reconstructed image data. Furthermore, a first RF shielding portion is provided, which completely encloses the image generating unit except for at least one opening for exchanging the image data with the surrounding environment. Furthermore, the apparatus has a horn-shaped second RF shielding portion, which is electrically connected with the first RF shielding portion, and is arranged mechanically around the at least one opening such that the at least one opening opens into the horn-shaped second RF shielding portion.

By using the horn-shaped second RF shielding portion, damping of any RF signals that may be undesirably, but unavoidably emitted is achieved. The horn-shaped second RF shielding portion is operated below its cut-off wavelength of such RF signals. No further optical devices have to be provided between the image generating unit and the projection surface for the image data, or the components to be imaged. In this way, the image data generated are not distorted by any optical elements such as lenses or prisms, and effective shielding is nonetheless achieved with regard to the MR scanner.

The image data generated, or an optical beam with the image data, emerges from the image generating unit with an angle of view, wherein the opening angle of the horn-shaped second RF shielding portion is substantially determined by this angle of view. This means that the opening angle of the horn-shaped second RF shielding portion is substantially determined by the visual field and the angle of view of the image generating unit. The optical beam of the generated image data as far as possible should not touch the internal walls of the horn-shaped second RF shielding portion, such that the optical beam is not impaired by the geometry of the horn-shaped shielding portion.

The horn-shaped second RF shielding portion may have a rectangular cross-section, for example. This is advantageous for the conventionally rectangular image data, minimizing the widthwise dimensions of the horn-shaped portion, since the internal volume of the horn-shaped portion is substantially filled by the image data.

The depth of the horn-shaped second RF shielding portion is preferably selected not randomly but rather specifically, such that attenuation of the RF field, which exits from the image generating unit through the at least one opening, is attenuated depthwise in propagation to its propagation through the horn-shaped second RF shielding portion, wherein the attenuation is greater than a defined lower limit value. The frequency of the observed RF field is here at the resonant frequency of the MR scanner and differs from this at most by a defined frequency value. This means that, within a measurement band of the MR system around the resonant frequency, the depth of the horn-shaped RF shielding portion is selected so as to achieve a desired attenuation of the RF fields that are emitted from the image generating unit through the opening.

The horn-shaped RF shielding portion has an inlet cross-section, at the at least one first opening, which is smaller than the outlet cross-section at the opposite end of the horn-shaped second RF shielding portion. The inlet cross-section is preferably of rectangular configuration, with a width b. The depth can then be calculated on the assumption that the width is much smaller than the wavelength of the RF field that exits from the at least one opening in the direction of the horn-shaped second RF shielding portion.

The image generating unit may have a camera that captures image data from the area surrounding the MR system, for example to identify the positioning of the person under examination, to identify the MR transmit and receive coils use, etc. Furthermore, the image generating unit may have a projector for projecting image data onto a predetermined region of the MR scanner. In addition, the image generating unit may have an infrared camera and a 3D depth sensor for determining three-dimensional motion in a visual field of the depth sensor. A separate opening may be provided in the first RF shielding respectively for each of the various modules of the image generating unit.

The invention further concerns a method for determining the geometry of a horn-shaped second RF shielding portion of the above-described apparatus, wherein the first RF shielding portion is provided that completely encloses the image generating unit apart from the at least one opening for exchanging image data with the surrounding environment. Furthermore, the depth is determined for the horn-shaped second RF shielding portion such that attenuation of the RF field that exits from the image generating unit through the at least one opening is greater depthwise than a defined lower limit value, as the RF field propagates through the horn-shaped second RF shielding portion. The depth is calculated for an RF field with a frequency that differs from the resonant frequency of the MR scanner by at most a defined frequency value. The horn-shaped second portion with the given depth is then mounted around the at least one opening, and is electrically connected therewith, such that the at least one opening opens in the horn-shaped second RF shielding portion.

This means that a desired attenuation may be defined that is to be achieved at least by the horn-shaped portion, for example 10 or 20 dB. The depth is then calculated such that the desired attenuation for RF fields is achieved in the range of the resonant frequency of the MR scanner.

When determining the depth, the attenuation of the RF field may for example be calculated using the following formula:

$$A_{[dB]} = 27.33 \cdot \int_0^d \frac{1}{a(x)} dx = 27.33 \frac{\ln\left(1 + \frac{d}{a_0} 2\tan\theta\right)}{2\tan\theta}$$

Here, A is the attenuation in dB, d is the depth of the horn-shaped RF shielding portion, the angle $\theta$ is half the opening angle of the horn-shaped RF shielding portion, $a_0$ describes the width of the horn-shaped RF shielding portion at the at least one opening, i.e. at the inlet window, and $a(x)$ describes the geometric shape of the horn-shaped RF shielding portion in the depth direction.

The features described above and below can be used not only in the correspondingly explicitly described combinations but also in further combinations, unless explicitly stated otherwise, or individually without going beyond the scope of protection of the invention.

BRIEF DESCRIPTION OF THE DRAWINGS

FIG. 2 is a schematic illustration of the optical beam profile of the system of FIG. 1, which has a projector for projecting image data or a camera for generating image data.

FIG. 3 is a schematic illustration of the shielding of the system for generating image data.

FIG. 7 is a flowchart of the steps for configuring an apparatus for generating non-diagnostic image.

DESCRIPTION OF THE PREFERRED EMBODIMENTS

The present invention is described in greater detail below on the basis of preferred embodiments with reference to the appended drawings. Identical or similar elements are labeled with the same reference signs in the figures. The figures should moreover be understood to be schematic diagrams of different embodiments of the invention. The elements illustrated in the figures are not necessarily shown to scale, but rather they are reproduced such that their function and purpose are comprehensible to a person skilled in the art. The connections between functional units or other units shown in the figures may be implemented as indirect connections, wherein a connection may be wireless or wired. Functional units can be implemented as hardware, software or a combination of hardware and software.

Figure 1:
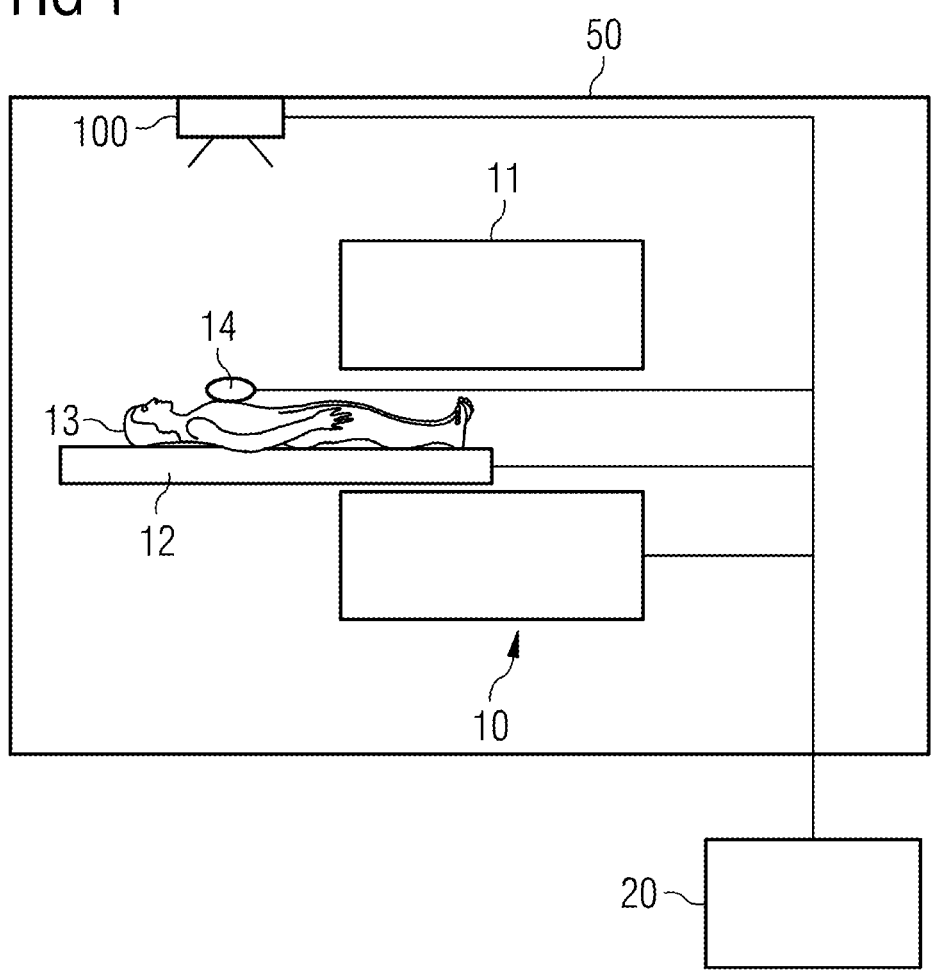
FIG. 1 is a schematic illustration of the use of an apparatus for generating non-diagnostic image data in an examination chamber of an MR scanner.

FIG. 1 shows an MR scanner 10 with which MR images may be produced. The MR scanner 10 has a magnet 11 that generates a polarization field $B_0$, wherein a person under examination 13, on a bed 12, is advanced into the magnet 11 for the purpose of acquiring spatially encoded magnetic resonance signals from the person under examination 13. The RF coil 14 used for signal detection is illustrated schematically. The magnetization generated by the polarization field $B_0$ can be deflected from the equilibrium position and spatially encoded by applying RF pulses and switching magnetic field gradients, wherein the resultant magnetization is detected by the coil 14. The manner in which raw data for reconstructing MR images, by applying RF pulses and switching magnetic field gradients in various combinations and sequences is known to those skilled in the art, and thus need not be explained in more detail herein. The MR signals detected by the coils are very low amplitudes, such that highly sensitive RF receive and transmit coils have to be used to receive the MR signals to be detected.

In the chamber or room in which the MR scanner 10 is accommodated, a system 100 is additionally provided that is capable of generating non-MR images, i.e. non-diagnostic images of the area surrounding the MR scanner. The image generating system may, for example, use a camera, such as an LCD camera, which is designed to capture images from the region around the MR scanner. The image data can then be evaluated to identify how the person under examination 13 is positioned on the bed 12, which receive coils 14 are being used, etc. The image generating unit may also take the form of a projector, which projects image data onto a surface which is visible to the person under examination 13 when he or she is lying in the MR system, for example for functional imaging. For precise identification of the objects in the area surrounding the MR scanner 10, the image generating unit may also have an infrared camera and/or a 3D depth sensor, e.g. a Time-of-Flight sensor for determining three-dimensional motion in a visual field of the depth sensor. The MR scanner 10 has a control computer 20, which is used to operate the MR scanner 10 and to control the image system. The control computer 20 may be situated outside the examination chamber 50. An operator may control the individual components of the MR scanner 10 and the image generating system 100 via the control computer 20.

FIG. 2 is a schematic representation of how the image generated by the system 100 proceeds from the image generating unit of the system 100. A beam path propagates in the horizontal direction at an opening angle $2\theta$, wherein the horizontal opening angle may be between 50 and 60 degrees. In the vertical direction the propagation angle is $2\gamma$, wherein this angle may be between 40 and 50 degrees. In the case of a projector, the generated image data are projected onto a projection surface 25. In the case of a camera sensor, the objects lying in the visual field 26 are depicted. The projection surface lies at the distance D in front of the system 100, wherein the system has a horn-shaped RF shielding portion 120 which attenuates RF fields in the MR system resonant frequency range to the extent that they no longer significantly affect MR system signal detection by the receive coils 14. As shown in FIG. 2, the opening angle of the horn-shaped RF shielding portion is here selected such that it substantially follows the course of the optical beam of the image generating unit and has no effect on it.

In FIG. 3 the system 100 for generating image data is shown in greater detail, wherein the system 100 has the horn-shaped RF shielding portion 120 and a first shielding portion 110 in which the image generating unit is located. The first RF shielding portion 110 completely encloses the image generating unit. The power supply and the lines for the video signals 80 are likewise shielded by shielding 90. The shielding components, i.e. the shielding 90, the first RF shielding portion 110 and the horn-shaped RF shielding portion 120 are connected together electrically and mechanically and may moreover be connected to main RF shielding which is built into the walls of the examination chamber 50. Furthermore, it is possible for video information to be transmitted by modulation into optical signals transmitted via an optical fiber. Furthermore, the information may be transmitted from the image generating unit within the first RF shielding portion 110 to the control computer 20 on an RF carrier, for example a frequency of 2.4 GHz.

The first RF shielding portion 110 may have an opening 111 for a camera, an opening 112 for an infrared sensor and an opening 113 for a 3D depth sensor.

The horn-shaped shielding portion 120 may take the form of a rectangular frustum, wherein, on connection of the horn-shaped shielding portion 120 to the rectangular first RF shielding portion, the horn-shaped shielding portion has an inlet window with an inlet cross-section with the dimensions $a_0$ for the width or major length of the rectangular inlet cross-section and the magnitude $b_0$ for the height or minor length of the rectangular inlet cross-section. At the outlet portion, the horn-shaped shielding portion has an outlet cross-section which is likewise rectangular and is defined by the width $a_1$ and the height $b_1$. The depth of the horn-shaped shielding portion is designated d.

As mentioned, the horizontal and vertical opening angles $2\theta$ and $2\gamma$ respectively are selected such that the image signals emitted by the openings 111 to 113 are not interfered with in their propagation angle by the horn-shaped portion, or if so are interfered with only minimally.

It will now be explained below how the depth d is determined so that an RF field exiting from the first RF shielding through one of openings 111 to 113 is damped to such an extent that capture of the MR signals is substantially no longer affected. To this end, the RF fields must be attenuated in particular in the range of the resonant frequency of the MR system, i.e. in a measurement band about the resonant frequency. In an MR system with a polarization field $B_0$ of one tesla, the resonant frequency is approximately 42 MHz, at 1.5 tesla it is 63 MHz and at three tesla it is correspondingly higher according to the formula $\omega=\gamma*B_0$ with $\gamma$ being the gyromagnetic ratio, which amounts to approximately 42 MHz per tesla. The measurement band for detecting the MR signals amounts to approximately 1 to 2 MHz, such that in this frequency range about the resonant frequency the receive coils may detect MR signals or other troublesome RF signals.

It will now be explained how the depth d has to be configured so as to ensure that possible electromagnetic interference (EMI) is attenuated to such a degree that the MR system's signal detection is no longer interfered with. The horn-shaped shielding portion may be understood as a horn-shaped waveguide which is operated below its cut-off wavelength $f_c$.

Figure 4:
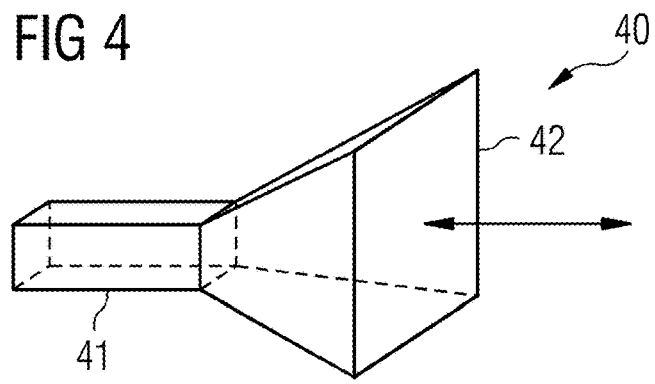
FIG. 4 is a schematic illustration of an illustration of a horn antenna according to the prior art with a rectangular waveguide.

As can be seen from FIG. 4, for calculation purposes a horn antenna 40 is taken as basis, with a waveguide 41 and a horn-shaped antenna region 42, wherein the signal is emitted from the horn-shaped antenna region 42. The cut-off wavelength of the horn antenna is determined by the geometry of the waveguide. It is clear from a comparison of FIGS. 3 and 4 that the system according to the invention 100 does not have the waveguide 41 but rather only a horn-shaped RF shielding portion which corresponds to the horn antenna 42.

Figure 5:
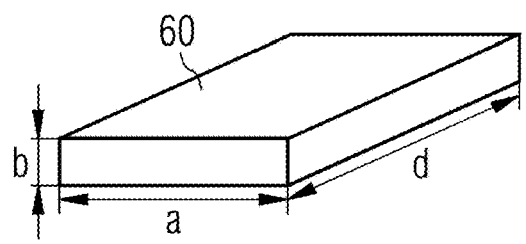
FIG. 5 is a schematic illustration of a rectangular waveguide which may be used to calculate the shielding.

The cut-off wavelength $f_c$ or $\lambda_c$ of a waveguide 60, as shown in FIG. 5, is the frequency at which the half wavelength is equal to the maximum width a, such that a is equal to $\lambda_c/2$. The dimension b, i.e. the height of the waveguide, is in this respect of no significance. Electromagnetic energy with frequencies below the cut-off wavelength do not propagate in the waveguide. The energy with frequencies lower than the cut-off wavelength are attenuated exponentially and, once a distance d has been covered, a total attenuation A is achieved, which is expressed by the known equation:

$$A_{[dB]} = 27.33 \cdot d \cdot \mathrm{img}\left(\sqrt{\frac{4}{\lambda^2} - \frac{1}{a^2}}\right) \quad (1)$$

In the case of frequencies in the area surrounding an MR system, the resonant frequencies are between 42 MHz and 126 MHz for one tesla and three tesla. Assuming a magnitude a of roughly 10 cm and a wavelength at three tesla of $\lambda_c/2=117$ cm or $\lambda_c/2=243$ cm at 1.5 tesla, it is justified to assume that $\lambda_c/2$ is much greater than a. The result is that the fraction under the square root sign is negative, giving rise to a complex number, wherein only the imaginary part is relevant to attenuation, while the real part determines the phase response of the emitted RF wave. If $\lambda_c/2$ is now much greater than a, the above equation 1 may be approximated by the following formula:

$$A_{[dB]} = 27.33 \cdot \frac{d}{a} \quad (2)$$

Figure 6:
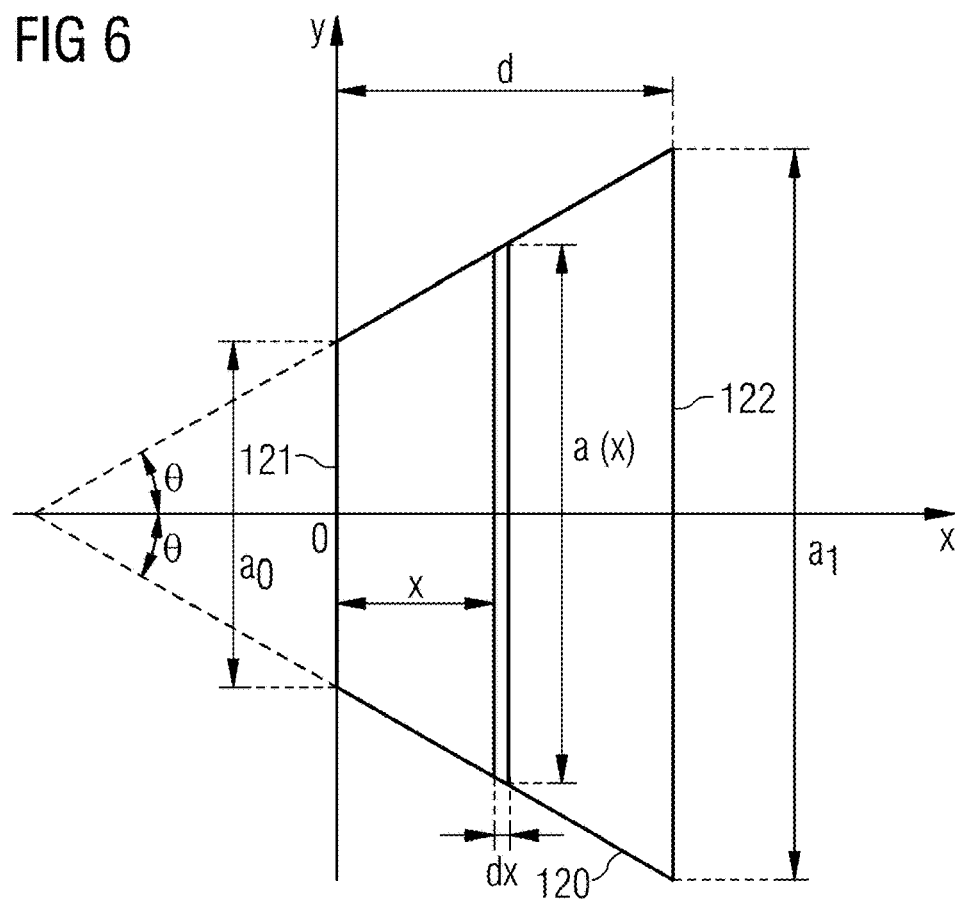
FIG. 6 is a schematic illustration of the geometry of how the shielding is calculated, according to the invention, in the horn-shaped shielding portion.

FIG. 6 is a schematic representation of how attenuation may be calculated for a depth d of the horn-shaped shielding portion 120. The horn-shaped RF shielding portion 120 has an inlet cross-section 121 at the opening and an outlet cross section 122 at the exit face 122. Furthermore, the horizontal angle of view is depicted relative to an axis of symmetry X, such that the entire horizontal angle of view amounts to 2θ, as may be seen in FIG. 6. At the inlet face 121 the horn-shaped shielding portion has the width $\alpha_0$, while at the outlet cross-section the width $\alpha_1$ is present.

With the geometry shown in FIG. 6, attenuation may now be calculated by an integral in the direction of the depth X using the following formula $$A_{[dB]} = 27.33 \cdot \int_0^d \frac{1}{a(x)} dx = 27.33 \frac{\ln\left(1 + \frac{d}{a_0} 2\tan\theta\right)}{2\tan\theta} \quad (3)$$

If, for example, a horizontal opening angle of 2θ equal to 57 degrees is assumed, the tangent of θ is roughly 0.5 and the above equation 3 may be approximated by the following equation:

$$A_{[dB]} \cong 27.33 \cdot \ln\left(1 + \frac{d}{a_0}\right) \quad (4)$$

It is thus possible to calculate a desired shielding as a function of the depth d. In the following table the attenuations achieved are indicated for various geometries. As can be seen, for a depth d of 20 or 30 cm an attenuation of over 30 dB has been achieved, which is deemed sufficient. A minimum attenuation, i.e. the lower limit value, may be 20 dB, for example. It goes without saying that other minimum attenuation limit values may also be used, such as 10 dB, 15 dB or 25 dB.

|  | $a_0$[cm] | $a_1$[cm] | d[cm] | A[dB] |
| --- | --- | --- | --- | --- |
| Geometry 1 | 10 | 30 | 20 | 30 |
| Geometry 2 | 10 | 40 | 30 | 37 |

FIG. 7 summarizes the steps which may be carried out to provide a system for generating image data. The method starts with a step S70 and in a step S71 the image generating unit is provided with the first RF shielding portion 110. In a second step S72 the horizontal and vertical opening angle of the sensors used in the image generating unit may then be determined, wherein the opening angle of the horn-shaped shielding portion 120 may thus be defined. In a step S73 the depth is then determined as explained above for the horn-shaped shielding portion. When selecting the opening angle and the width, account should be taken of the fact that the broader the width of the horn-shaped shielding portion, i.e. the magnitude $\alpha_0$, the less the attenuation, wherein the attenuation increases in magnitude again as the depth d increases. For the entire magnitude of the system 100, the opening angle, the width $\alpha_0$ and the depth d thus have to be matched to one another such that a desired attenuation is achieved in the resonant frequency range of the MR system. In step S74 the horn-shaped shielding portion with the given depth may then be combined with the first shielding portion so as to achieve the system illustrated in FIG. 3. The method ends with step S75.

In summary, the above-described invention results in a system for generating image data which is favorable to produce, since no additional optical systems are needed for guiding beams in a waveguide, wherein nonetheless affects on the MR system by possible RF fields originating from the system are minimized by the previously determined attenuation in the resonant frequency range of the MR system. The horn-shaped shielding portion does not interfere with the beam path of the image data. Furthermore, the described system may be combined with commercially obtainable video devices or projectors for image generation purposes.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. An apparatus for generating non-magnetic resonance (MR) image data in an examination chamber of an MR system, the apparatus comprising:
    an image generating unit configured to generate non-MR image data;
    a first radio-frequency (RF) shielding portion that encloses the image generating unit except for an opening allowing an exchange of the non-MR image data with a surrounding environment of the image generating unit; and
    a horn-shaped second RF shielding portion, having a rectangular cross-section, situated around the opening of the first RF shielding portion, the horn-shaped second RF shielding portion being electrically connected with the first RF shielding portion, and the opening of the first RF shielding portion opening into the horn-shaped second RF shielding portion.

2. An apparatus as claimed in claim 1, wherein the image generating unit is configured to emit an optical beam having an associated angle of view, and
    wherein the horn-shaped second RF shielding portion has an opening angle that is adapted to the angle of view.

3. An apparatus as claimed in claim 1, wherein the horn-shaped second RF shielding portion has a depth so as to attenuate an RF field that exits from the image generating unit through the opening of the first RF shielding portion,
    wherein the depth of the horn-shaped second RF shielding portion is larger than a predetermined lower limit value of propagation of the RF field through the horn-shaped second RF shielding portion, and
    wherein the RF field has a frequency that differs from a resonant frequency of the MR system.

4. An apparatus as claimed in claim 3, wherein the horn-shaped second RF shielding portion has an inlet cross-section at the opening of the first RF shielding portion that is smaller than an outlet cross-section of the horn-shaped second RF shielding portion at an opposite end thereof, and
    wherein the inlet cross-section at the opening of the first RF shielding portion is rectangular and has a width that is smaller than a wavelength associated with the RF field.

5. An apparatus as claimed in claim 2, wherein the image generating unit is configured to emit an optical beam from the image generating unit at an angle of view, and wherein the horn-shaped second RF shielding portion has an opening angle that avoids the horn-shaped second RF shielding portion from being imaged in image data generated by the optical beam.

6. An apparatus as claimed in claim 1, wherein the image generating unit comprises a camera configured to acquire image data from an area surrounding the MR system.

7. An apparatus as claimed in claim 1, wherein the image generating unit comprises a projector configured to project image data onto a predetermined region of the MR system.

8. An apparatus as claimed in claim 1, wherein the image generating unit comprises a detector including at least one of an infrared camera and a 3D depth sensor, and wherein the image generating unit is configured to detect 3D motion in a visual field of the detector.

9. A method for shielding an image generating unit situated in an examination chamber of a magnetic resonance (MR) system, the method comprising:

enclosing the image generating unit with a first RF shielding portion except for an opening through which the image generating unit exchanges image data with a surrounding environment of the image generating unit;

determining a depth for a horn-shaped second RF shielding portion, having a rectangular cross-section, that surrounds the opening of the first RF shielding portion so as to attenuate an RF field that exits from the image generating unit through the opening of the first RF shielding portion by making the depth larger than a predetermined lower limit value of propagation of the RF field through the horn-shaped second RF shielding portion, the RF field having a frequency that differs from a resonant frequency of the MR system; and mounting the horn-shaped second RF shielding portion, with the depth around the opening of the first RF shielding portion so that the opening of the first RF shielding portion opens into the horn-shaped second RF shielding portion and electrically connects the horn-shaped second RF shielding portion with the first RF shielding portion.

10. A method as claimed in claim 9, comprising:

providing the horn-shaped second RF shielding portion with an inlet cross-section at the opening of the first RF shielding portion that is smaller than an outlet cross-section at an opposite end of the horn-shaped second RF shielding portion, wherein the inlet cross-section at the opening of the first RF shielding portion is rectangular having an associated width, and wherein the depth of the horn-shaped second RF shielding portion results in the width of the inlet cross-section being smaller than a wavelength associated with the RF field.

11. The method as claimed in claim 10, wherein the depth of the horn-shaped second RF shielding portion produces the attenuation of the RF field according to:

$$A_{[dB]} = 27.33 \cdot \int_0^d \frac{1}{a(x)} dx = 27.33 \frac{\ln\left(1 + \frac{d}{a_0} 2\tan\theta\right)}{2\tan\theta}$$

wherein:

A represents the attenuation in dB, d represents the depth of the horn-shaped second RF shielding portion, θ represents an opening angle of an opening of the horn-shaped second RF shielding portion, $a_0$ represents the width of the inlet cross-section of the horn-shaped RF shielding portion, and a(x) represents a geometric shape of the horn-shaped second RF shielding portion as a function of x, with x being in a direction of the depth.

12. A magnetic resonance (MR) apparatus comprising:

an MR data acquisition scanner situated in an examination chamber;

an image generating unit in the examination chamber, the image generating unit configured to generate non-MR image data;

a first radio-frequency (RF) shielding portion that encloses the image generating unit except for an opening allowing an exchange of the non-MR image data with a surrounding environment of the image generating unit; and a horn-shaped second RF shielding portion, having a rectangular cross-section, situated around the opening of the first RF shielding portion, the horn-shaped second RF shielding portion being electrically connected with the first RF shielding portion, and the opening of the first RF shielding portion opening into the horn-shaped second RF shielding portion.

* * * * *